United States Patent [19]
Aria et al.

[11] Patent Number: 4,870,622
[45] Date of Patent: Sep. 26, 1989

[54] DRAM CONTROLLER CACHE

[75] Inventors: Percy R. Aria, Sunnyvale; Sherman Lee, Rancho Palos Verdes, both of Calif.

[73] Assignee: Advanced Micro Devices, Inc., Sunnyvale, Calif.

[21] Appl. No.: 211,511

[22] Filed: Jun. 24, 1988

[51] Int. Cl.$^4$ .............................................. G11C 7/00
[52] U.S. Cl. ...................... 365/230.02; 365/230.03; 365/238.5
[58] Field of Search ........... 365/189, 230, 233, 230.02, 365/230.03, 238.5, 193

[56] References Cited
U.S. PATENT DOCUMENTS 4,725,945 2/1988 Kronstadt et al. .............. 365/230 X
4,803,621 2/1989 Kelly ............................... 365/230 X Primary Examiner—Joseph A. Popek
Attorney, Agent, or Firm—Salzman & Levy

[57] ABSTRACT

A method of minimizing memory access time on a memory with multiplexed address inputs between data stored in locations in memory in the same row but in different columns. First data is accessed at a predetermined column and row location. The predetermined row location of the first data is then recorded. The location of second data is then recorded. Then the locations of the first and second data are compared. A row compare signal is generated if the row value of both first and second data are identical. Only the column address is varied in response to the row compare signal.

20 Claims, 6 Drawing Sheets

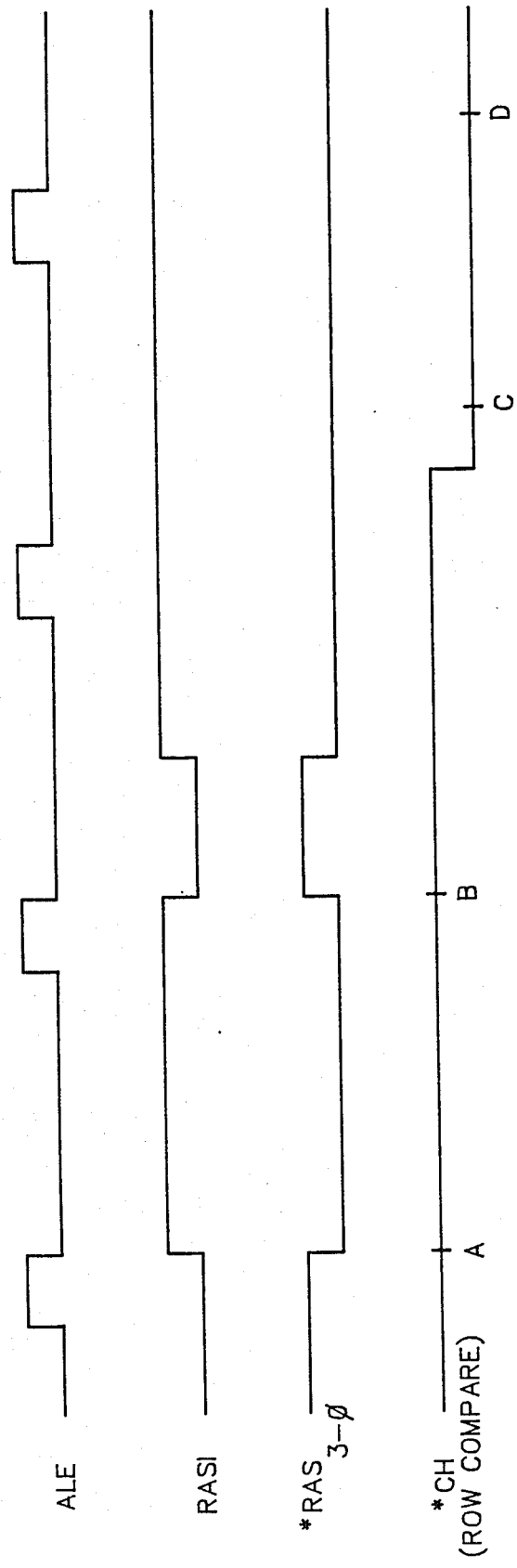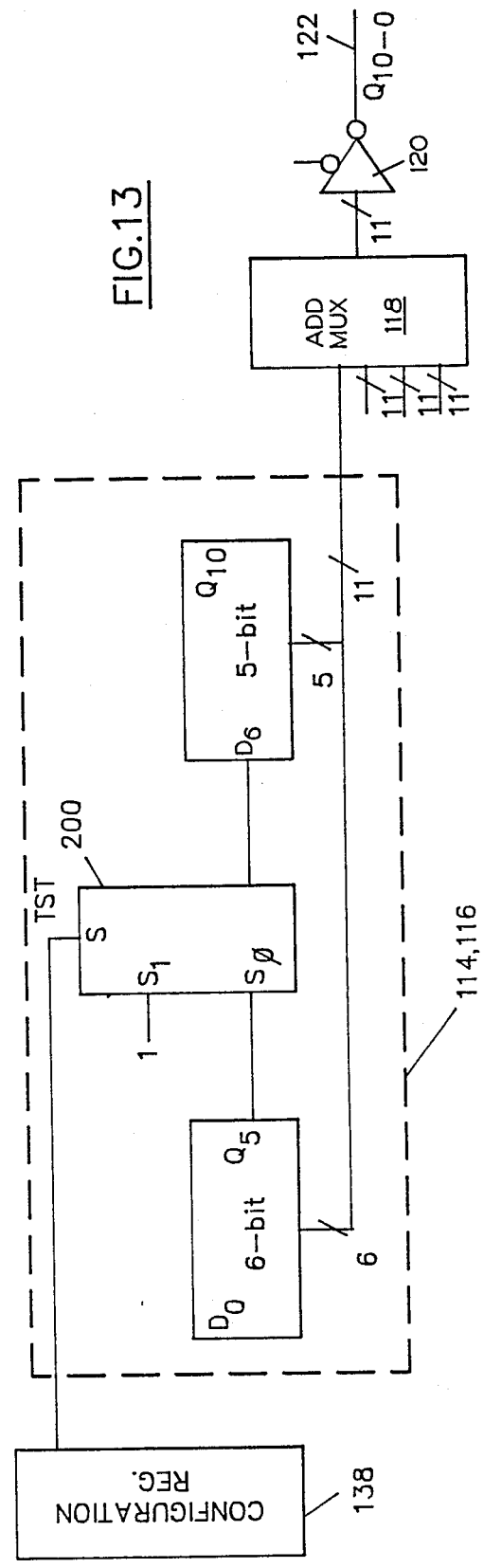

DRAM CONTROLLER CACHE

BACKGROUND OF THE INVENTION

The present invention relates to accessing data in memory and, more particularly, to minimizing memory access time on a memory with multiplexed address inputs.

In data processing systems having multiplexed address input memory devices, such as dynamic random access memories (DRAMs), the amount of time required to access data (i.e., read data from memory or store data therein) in predetermined locations affects overall system performance. Due to the fact that many data addresses are used per second, a delay in accessing any one memory location or group of locations can be substantial over the course of significant lengths of time.

DRAMs are often logically structured into separate banks with rows and columns within the banks. Such an organization has been found to be a great aid to data accessing techniques, since intersections of elements can generally be accessed more rapidly using random access techniques than can individual memory elements using sequential or serial access techniques. Within this structure and organization, however, a great number of systems have been devised to minimize access time.

Since DRAMs are dynamic devices, precharging of voltage is required to reach or exceed predetermined thresholds to ensure proper operation of certain internal nodes. Data integrity is ensured only if precharging occurs.

The act of precharging, unfortunately, requires a significant amount of time—on the order of 50 nanoseconds on a 100 nanosecond DRAM. This means that about 50% of access time is used for precharging.

Conventionally, data accessing occurs on a purely random basis, so that precharging occurs for every data item, irrespective of where it is located and regardless of the location of the previously accessed data. Since precharging accounts for about half of access time, it is clear that by reducing the precharging requirement access time can be greatly minimized.

It has been found that for groups of data accesses in normal data processing applications, more than half of the time two data locations to be accessed immediately after one another are located in the same row, but in different columns, in DRAM. This statistic is especially relevant for executing programs in which instructions are stored in sequential locations. In those cases, over 75% of the time a data element (program instruction) is located in the same row of memory as the previously accessed data element. Of course, one cannot predict with certainty whether a location to be accessed will be near the previously accessed location. But since statistics are often in favor of such close proximity of data, it would be advantageous to exploit this phenomenon.

It would also be advantageous to avoid precharging when possible.

It would also be advantageous to provide a system for accessing data located close to previously accessed data on a more efficient basis.

It would also be advantageous to update the location of currently accessed data so that it can be compared to previously accessed data when necessary.

SUMMARY OF THE INVENTION

In accordance with the present invention, there is provided a method of minimizing memory access time on a memory with multiplexed address inputs between data stored in locations in memory in the same row but in different columns. First data is accessed at a predetermined column and row location. The predetermined row location of the first data is then recorded. The location of second data is then recorded. Then the locations of the first and second data are compared. A row compare signal is generated if the row value of both first and second data are identical. Only the column address is varied in response to the row compare signal.

BRIEF DESCRIPTION OF THE DRAWINGS

A complete understanding of the present invention may be obtained by reference to the accompanying drawings, when taken in conjunction with the detailed description thereof and in which:

FIG. 12 is a timing diagram depicting interaction of signals during memory access operations;

FIG. 13 is a simplified schematic block diagram showing the counter testing mechanism in greater detail.

DESCRIPTION OF THE PREFERRED EMBODIMENT

Figures 1, 2, 3, 4, 5:
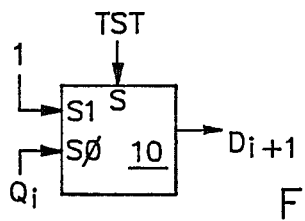
FIG. 1 is a schematic representation of an 8-bit electronic counter with carry inputs.
FIG. 2 is a simplified schematic diagram of an externally generated forced carry input circuit.
FIGS. 3–5 are schematic representations of an 8-bit counter separated into two sections.

Referring now to FIG. 1, there is shown a schematic representation of an 8-bit electronic counter with carry systems. The eight bits are labeled 0–7 and, in this FIGURE, are all set to 0. The lowest significant bit is shown at the extreme leftmost part of the FIGURE and the most significant bit is shown at the rightmost part.

Referring now also to FIG. 2, there is shown a simplified, isolated logic device (multiplexer) 10 helpful for purposes of instruction to which is connected a preset bit level of 1, and input bit $Q_i$, where i is the bit position of the counter, not shown. A test bit TST, hereinbelow explained in greater detail, is also input to the select input of the multiplexer 10. When TST is high, the input 1 is selected as port S1. When TST is low, however, the state of bit i is selected as input to the multiplexer 10. The output of the device 10 is depicted as $D_{i+1}$ representing the bit loaded in the next significant bit location. It reflects the status of the TST line. If the TST signal is high, the $i^{th}$ bit is input to the device 10 and is output as a high $i+1^{st}$ bit. For example, bit 3 input to the device 10 with the TST bit high will result in a forced carry to bit 4 of the counter. In other words, when TST is high then the output D is high; when TST is low then the output D is either high or low depending upon the value of Q. Therefore, if TST is low, then bit 3, when high, will result in the carry to bit 4 being high. Similarly, if TST is low and bit 3 is low, then the carry to bit 4 will be low.

Referring now also to FIG. 3, the 8-bit counter is shown separated into a low section and a high section, each having four bits. When a clocking operation begins, the value of the low section and the high section are incremented, one bit at a time, starting with the lowest significant bit, as shown in this Figure. The lowest significant bits in both low and high sections of the counter are clocked substantially simultaneously, as hereinbelow described.

Referring now also to FIG. 4, the four bits of the low section and the four bits of the high section of the counter eventually reach a maximum or highest value, consisting of all 1's. This value of the 4-/bit sections is reached after 15 clocking cycles. At this point, all bits 0-7 have been tested for proper toggling and all bits in the low section have been tested for proper carry operation.

Similarly, all four bits 4-7 of the high section of the counter have been tested for proper carry operation.

Moreover, a TST bit has been introduced to bit 4, the lowest significant bit of the high section, simulating a carry from the most significant bit (bit 3) of the low section of the counter.

Referring now also to FIG. 5, there is shown the state of both sections of the counter after the counter has been clocked one additional time. Note that all bits 0-3 of the low section and all bits 4-7 of the high section of the counter are set to 0. This is due to the fact that the TST bit has been disabled, allowing the low section to carry over to the high section naturally (i.e., not in a forced manner), resulting in bit 4 toggling to 0 and naturally carrying subsequent bits 5, 6 and 7 to 0 also.

Figure 6:
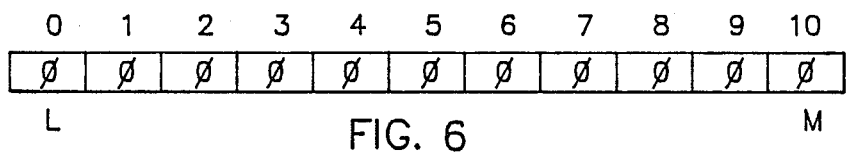
FIGS. 6–10 are schematic representations of an 11-bit electronic counter with carry inputs.

Referring now also to FIG. 6, there is shown an 11-bit counter. All bits of the counter are set to 0 initially.

Figure 7:
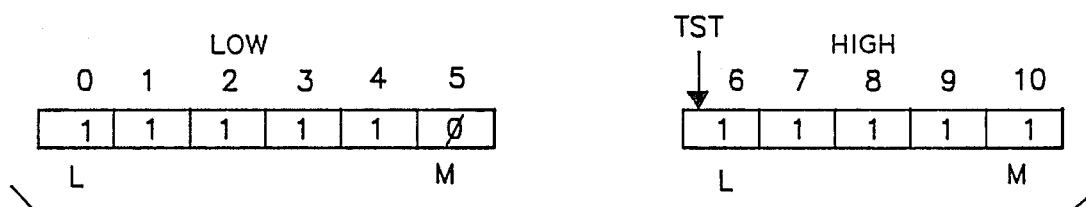

Referring now also to FIG. 7, the 11-bit counter has been separated into a 6-bit low section and a 5-bit high section. After 31 clock cycles, all but bit 5 of the low section have been toggled to the value 1.

Figure 8:
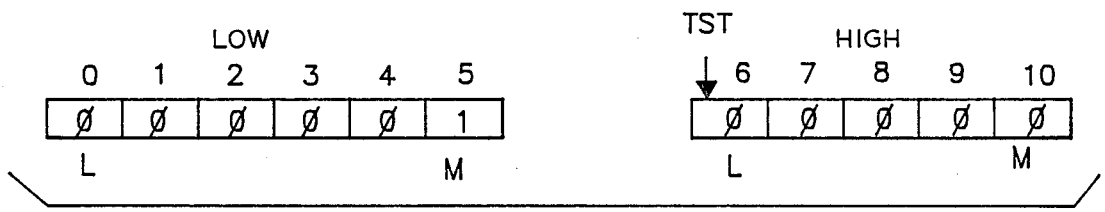

Referring now also to FIG. 8, the counter has been clocked one more time, resulting in all but bit 5 being set to 0. Both low and high sections have been clocked one more time resulting in the value shown in FIG. 8.

Figure 9:
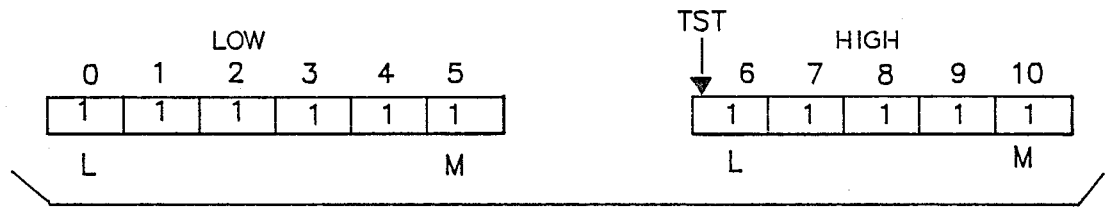

Referring now also to FIG. 9, there is shown both low and high sections of the counter after 31 more clocked cycles. At this point, all eleven bits are set to 1. The test bit is active from the beginning (FIG. 6) through the end of the counter (FIG. 9).

Figure 10:
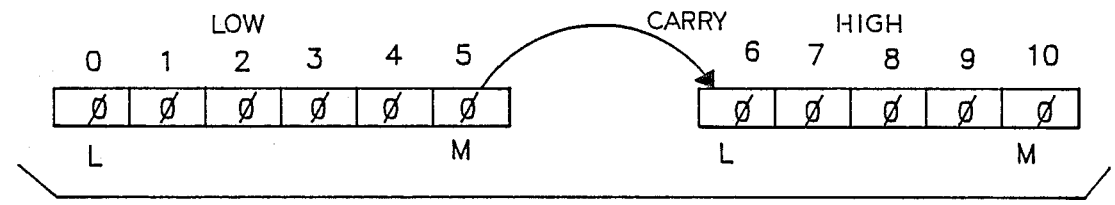

Referring now also to FIG. 10, after all eleven bits are set to the maximum value or the high value, the test bit TST is disabled. At this point the counter is incremented once more, resulting in the most significant bit of the low section being carried to the least significant bit of the high section. The resultant value of the counter is now 0 (all bits are set to 0). This procedure ensures that the carry operation from the low section to the high section is operating properly and, in particular, that bit 5 is carried to bit 6 properly.

Thus, it can be seen that all eleven bits are tested in a total of 65 steps or clock cycles. This test of the counter is an effective, complete one, including individual toggling from 0 to 1 and from 1 to 0 per bit as well as carry operations from all least significant bits to all corresponding most significant bits. The entire counter is therefore tested in the course of 65 clock cycles, rather than the $2^{22}$ clock steps that were conventionally required for this operation.

It can be seen that a counter having any number of bits can be tested completely if two or more sections are treated in the aforementioned manner. It becomes inefficient, however, to separate a counter into too many sections if the size of the counter is relatively small. In general, if one section has n and the other has n+1 bits, then $2(2^n-1)+3$ clock cycles are required to test the counter completely. It is most efficient to separate the odd-bit counter into two sections differing in size from one another by only one bit. In the case of equal sections of n bits each, however, the number of clock cycles required to test a counter completely by the aforementioned inventive technique is $2^n$.

Figure 11:
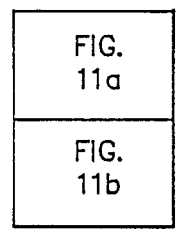
FIGS. 11a–11b taken together form a schematic circuit diagram of apparatus used to practice the inventive technique.
Figure 11A:
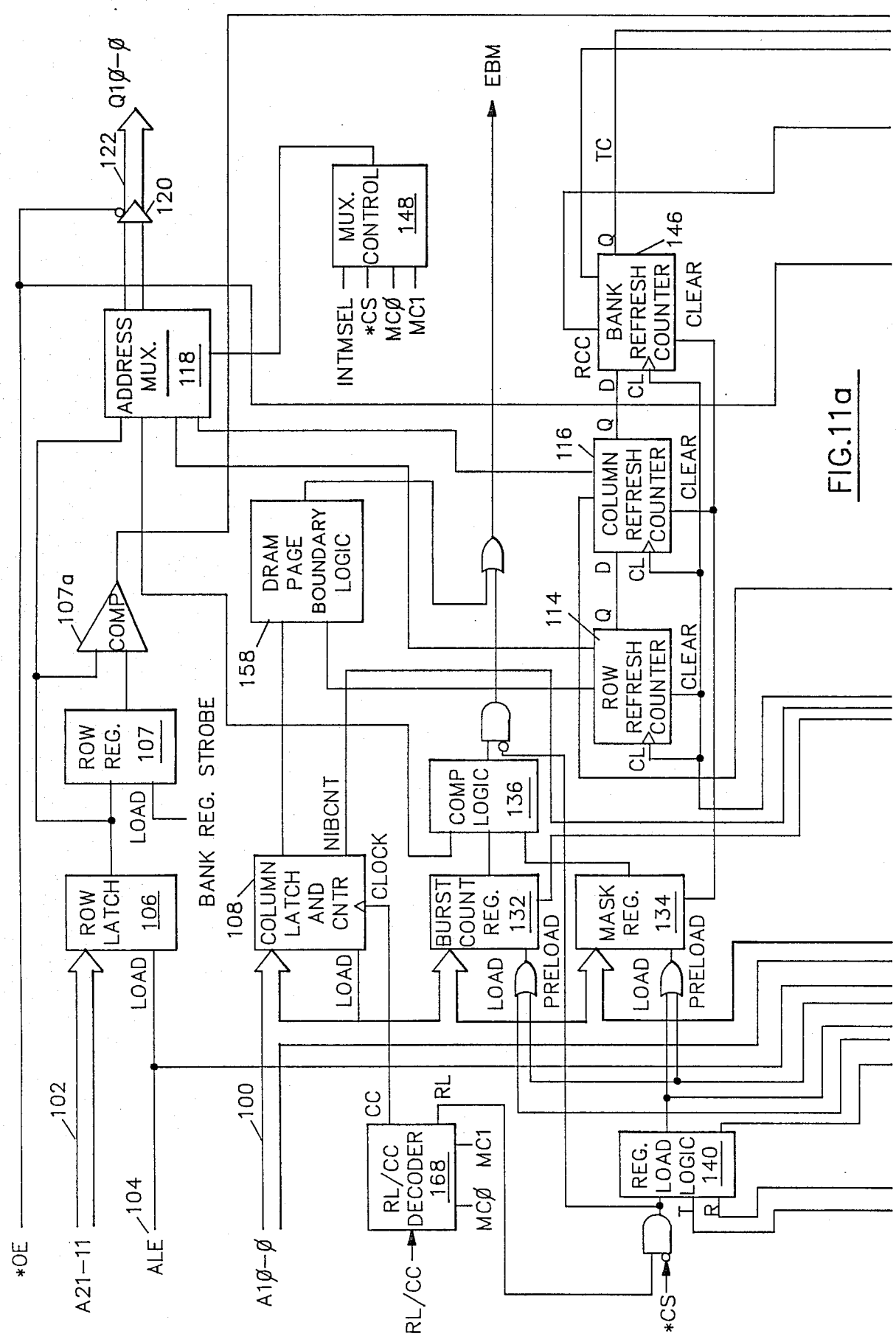
Figure 11B:
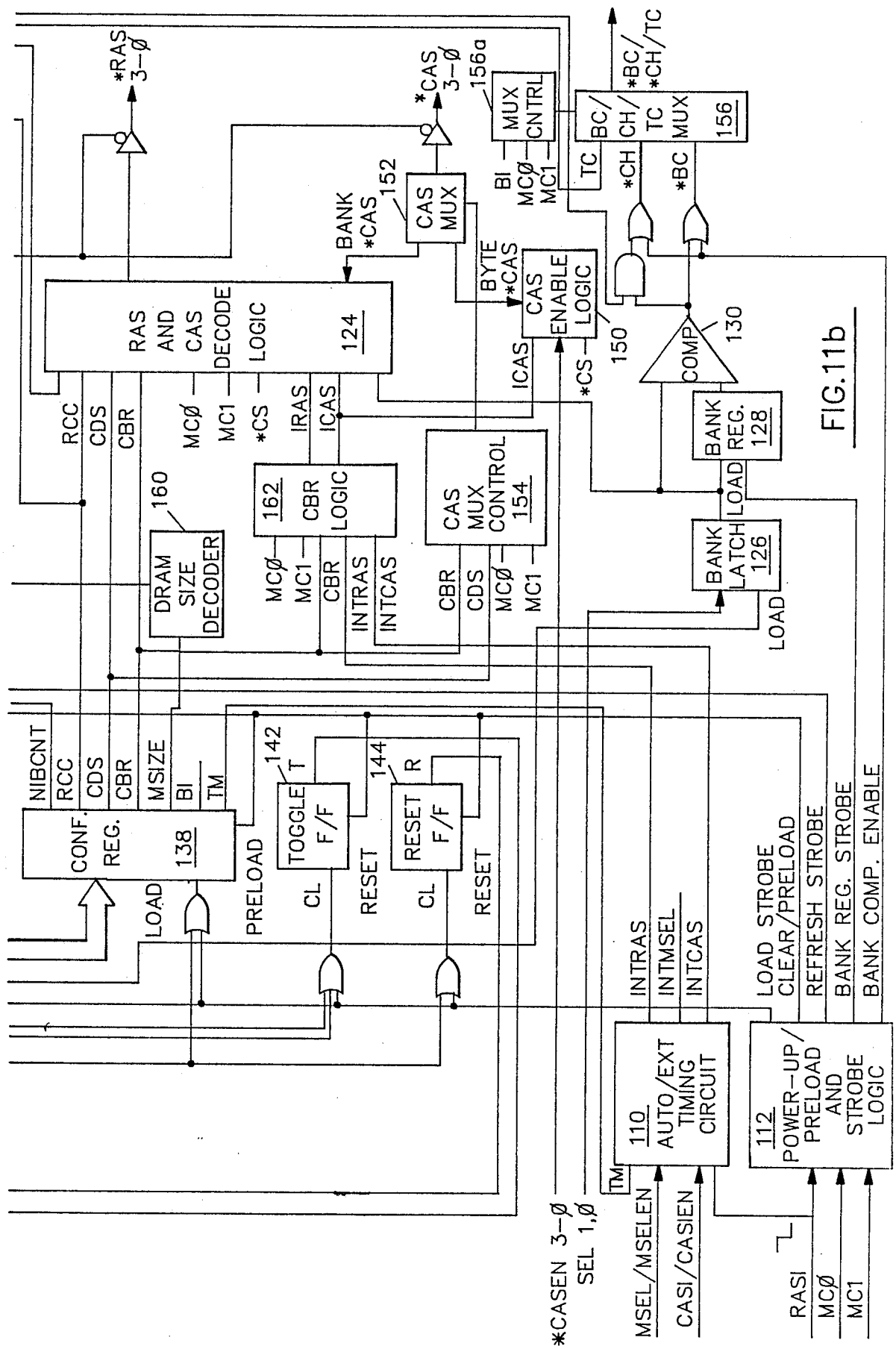

Referring now also to FIG. 11, which is depicted as FIGS. 11a-11b for convenience, a schematic circuit diagram is shown depicting apparatus for carrying out the present invention. The FIG. 11 depicts a dynamic random access memory (DRAM) controller which controls the address path between a processor, not shown, and a DRAM array, not shown. The controller uses an 11-bit row latch and an 11-bit column latch and counter 108 for multiplexing the row and column addresses respectively to any DRAM size up to 4M.

An 11-bit address bus 100 carries the lower half of address information and an 11-bit address bus 102 carries the higher half of address information. An Address Line Enable (ALE) signal 104 is applied to a row latch device 106 and to a column latch and counter device 108. An auto/external timing circuit is shown at reference numeral 110.

A power-up/preload and strobe logic device 112 is connected to row refresh counter 114 by means of a refresh line. Connected to the row refresh counter 114 is a column refresh counter 115. An address multiplexer 118 receives input from the row latch 106, the column latch and counter 108, the row refresh counter 114 and the column refresh counter 116. Connected to the output of the address multiplexer 118 is a tristate buffer 120 to which is attached an Output Enable (*OE) line. The output of the tristate buffer 120 is applied to the address bus 122, which has 11 bits. The bus 122 is connected to the address of the DRAM or DRAMs, not shown, connected to this controller.

Row address strobe (RAS) and column address strobe (CAS) decode logic are provided at reference numeral 124. The output of this decode logic 124 is applied to *RAS and *CAS signals. There are four RAS and CAS signals, one for each of four banks of memory in the preferred embodiment. For DRAMs with more banks, additional signals would be required; fewer banks would require less; and only one bank is also possible. Connected to the row latch 106 is a row register 107. The output of the row register 107 is applied to a comparator 107a.

The row latch 106 is an 11-bit latch. It holds the row address to the DRAM. The latch 106 becomes transparent when the Address Latch Enable (ALE) signal is high and the address is latched on the low going edge of ALE.

The row register 107 is also an 11-bit register. It holds the row address of the previous access to the DRAMs. The register 107 is clocked at the end of every access (in the normal and bank interleave access mode) or at the end of a cache access when a new row address is to be accessed, by the low going edge of RASI input.

The row comparator 107a is an 11-bit comparator. It compares the row address of the current access (contents of row latch 106) with that of the previous access (contents of row register 107) and generates a Row Compare (RC) signal. The Row Compare and the Bank Compare signals are ANDed to generate a *Cache Hit (*CH) signal. The *CH signal is low if the current row and bank addresses (contents of row latch 106 and bank latch 126) are the same as the previous row and bank addresses respectively, and it is high if the current row and/or bank addresses do not match the previous row and/or bank addresses. For systems having single bank DRAM configurations, it should be noted that only row and column parameters are required to identify locations of data in memory. In those instances, therefore, since there is no need to consider plural banks, a row/bank ANDing operation is not required to generate a *CH signal.

The *CH signal is used by the external timing generator 110 during cache mode either to keep the RASI input activated (high) if consecutive accesses are to the same row in the same bank (and hence save precharge time on the current $RAS_i$) or to deactivate the RASI input if consecutive accesses are to different rows and/or banks, thereby ending the cache access and indicating a cache miss.

The column latch and counter 108 is an 11-bit loadable counter. It holds the column address to the DRAMs. The counter becomes transparent when ALE is high and the address is loaded on the low going edge of ALE.

In the burst/block mode of access, the column latch and counter 108 is incremented by the low going edge of Column Clock (CC) thereby generating consecutive memory addresses.

The bank latch 126 is a 2-bit latch. It holds the bank address to the DRAMs. The latch 126 becomes transparent when ALE is high and the address is latched on the low going edge of ALE.

The bank register 128 is also a 2-bit register. It holds the bank address of the previous access to the DRAMs. The register 128 is clocked at the end of every access in the normal and bank interleave access mode by the low going edge of RASI.

The bank comparator 130 is a 2-bit comparator. It compares the bank address of the current access (contents of bank latch 126) with that of the previous access (contents of bank register 128) and generates a *Bank Compare (*BC) signal. The *BC signal is low if the current bank address is the same as previous bank address and is high if the current bank address does not match the previous bank address.

The *BC signal is used by the external timing generator 110 during bank interleaving either to activate the RASI input immediately if two consecutive accesses are to two different banks, or to delay the RASI input if two consecutive accesses are to the same bank.

The burst count register 132 is an 11-bit register. It is loaded via the address bus ($A_{10-0}$) 100 by the low going edge of the register load signal via register load logic. This register 132 is preloaded with all 1's (for a maximum burst count) in the reset mode after power-up.

The Mask Register 134 is an 11-bit register. It is loaded via the address bus ($A_{10-0}$) 100 by the low going edge of the register load signal via the register load logic. This register 134 is preloaded with all 1's (for all bits to participate in the comparison) in the reset mode after power-up.

The column comparator logic 136 compares the contents of the column latch and counter 108 with those of the burst count register 132, which contains the end of burst count value. The contents of the mask register 134 determine which of the eleven bits of the column latch and counter 108 and the burst count register 132 participate in the comparison.

The configuration register 138 is an 11-bit register. It is loaded via the address bus ($A_{10-0}$) 100 by the low-to-high edge of the register load (RL) signal via the register load logic. The configuration register 138 is programmed to select certain options, including the TST option, as hereinbelow described.

$TST_1$ and $TST_0$ bits are used for testing purposes. If either of the bits is set (1) then the active edge of RL will load the configuration register 138 only. These two bits are also used to test the 24-bit refresh counter. Each 11-bit row and column counter is divided into two counters, one of six bits and the other five bits, as explained in the general description relating to FIGS. 6-10 hereinabove.

If $TST_1$ is set (1) then the carry to the lowest significant bit of the 6-bit column counter and the lowest significant bit of the 2-bit counter is forced high. If $TST_1$ is reset (0) then the carry to the lowest significant bit of the 6-bit column counter comes from the most significant bit of the 5-bit row counter and the carry to the lowest significant bit of the 2-bit counter comes from the most significant bit of the 5-bit column counter. If $TST_0$ is set (1) then the carry to the lowest significant bit of the 5-bit row and column counters is forced high. If $TST_0$ is reset (0) then the carry to the lowest significant bit of the 5-bit row and column counters comes from the most significant bit of the respective 6-bit counters. Both of these bits ($TST_{1,0}$) are reset (0) in the reset mode after power-up.

The register load logic shown as reference numeral 140 loads the burst count 132, mask 134 and configuration registers 138 via the address bus 100. The reset flip flops 144 and toggle flip flops 142 determine which register is loaded as hereinafter described.

When the Register Load (RL) signal goes low the selected register goes transparent, accepting data from the address bus ($A_{10-0}$) and the output of the compare logic is disabled. The data is latched into the registers on the low-to-high edge of RL and the output of the compare logic is enabled when RL is high.

The first operation of reset after power-up is done automatically by the power-up reset logic, which clears the refresh counter 114,116, clears the reset flip flop 144 and toggle flip flop 142 and preloads the burst count 132, mask 134 and configuration 138 registers. These operations are also executed simultaneously on the inactive edge of RASI while holding the Mode Control lines $MC_{1,0}$ in the reset mode.

Next, the configuration register 138 may be loaded via address bus $A_{10-0}$ 100 by the active (low-to-high) edge of RL. The next active edge of RL will load the mask register 134 also via the address bus $A_{10-0}$ 100. The following active edge of RL will load the burst count register 132 also via the address bus $A_{10-0}$ 100. Any further activation of the RL signals will reload the mask register 134 and the burst count register 132 also via the address bus $A_{10-0}$ 100. Any further activation of the RL signal will reload the mask register 134 and the burst count register 132 individually in that order.

The row refresh counter 114 and column refresh counter 16 are eleven bits each and the bank refresh counter 146 is two bits. All three counters are synchronous. The counters 114,116,146 can be cleared by clocking them synchronously while holding their "clear" inputs active. The size of the row and column refresh counters 114,116 are established by selecting the proper row counter output to go to the low order column counter input. The selection is one by the DRAM size decoder outputs with the help of a multiplexer.

The address multiplexer 118 is an 11-bit four-input multiplexer. It selects one of the four 11-bit addresses as the address to the DRAMs. The four 11-bit address busses are from the row latch 106 output, the column latch and counter 108 output, the row refresh counter 114 output and the column refresh counter 116 output. The selection of one of the four addresses is done by a multiplexer control 140. The multiplexer control logic 140 generates the proper selection signal for the address multiplexer depending on the $MC_{1,0}$, INTMSEL and *CS input signals.

The RAS and CAS decode logic 124 decodes the IRAS and ICAS timing signals to generate the four *$RAS_i$ and the four bank CAS signals which in turn control the four banks of DRAMs. The decoding of the *$RAS_i$ signal is done by the *CS, $MC_{1,0}$, $SEL_{1,0}$, RCC signals.

CAS enable logic 150 is used if the byte decode scheme is selected as the CAS decode scheme. Byte enables are decoded externally and are connected to the *$CASEN_{3-0}$ input lines, which are also inputs to the CAS enable logic. All the *$CASEN_{3-0}$ signals are individually gated with the ICAS signal to generate the proper byte CAS signal. The CAS multiplexer 152 is a two to one, 4-bit wide multiplexer. It selects one set of *$CAS_i$ signals to the output depending on the CAS decode scheme being used and the operating mode. The CAS multiplexer control logic 154 elects the bank decoded CAS 124 or the byte CAS 150.

Logic 156 selects either the *Bank Compare (*BC) or the *Cache Hit (*CH) or the Terminal Count (TC) signals as the output on the triple function pin *BC/*CH/TC.

The output function depends on the mode control inputs. If the $MC_{1,0}$ inputs are [0 1], the controller is in the refresh with scrubbing or initialize mode and this output acts as the terminal count. In all other modes with $MC_{1,0}$ [0 0], [1 0]and [1 1] this output acts as either *Bank Compare or *Cache Hit signal depending on the state of the Bank Interleave (BI) bit in the configuration register. If BI=1 then *Bank Compare signal is selected and if BI=0 then the *Cache Hit signal is selected.

As *Bank Compare this output goes active (low) when the current memory access is to the same bank as the previous memory access and remains active until a memory access to a different bank is requested. This signal is used by the external timing generator during bank interleaving either to activate the RASI input immediately if two consecutive accesses are to two different banks or to delay the RASI input if two consecutive accesses are to the same bank.

As *Cache Hit this output goes active (low) when the current memory access is to the same row and the same bank as the previous access. This signal is used by the external timing generator 110 during the cache mode to allow the RASI to remain active. As terminal count this output goes active (high) when the refresh counter has gone through a entire count. The refresh counter 114,116,146 is automatically adjusted for DRAM size (64K, 256K, 1M or 4M) and number of DRAM banks (2 banks or 4 banks). These parameters are programmable via the RAS/CAS Configuration (RCC) bit [1]of the configuration register 138. This signal is used to indicate the end of initialization in an error detection and correction system.

The power-up, preload and strobe logic circuit 112 automatically presets the controller to the default configuration on power-up. This circuit 112 also generates all the signals and strobes to clear and clock the refresh counter 114,116,146, preload the configuration 138, the burst count 132 and the mask 134 registers, clear and clock the reset flip flop 144 and toggle flip flop 142, load the bank register 128 and disable the *Bank Compare output.

The Mode Control ($MC_{1,0}$) inputs set up the Clear/-Preload and/or Bank Compare Enable signals and the high-to-low edge of RASI input generates the refresh, load and bank register strobes depending on the $MC_{1,0}$ inputs.

In the reset mode ($MC_{1,0}$=1 1) the Clear/Preload signal is activated (1), the Bank Compare Disable signal is activated (1) and the low going edge of RASI in this mode generates the refresh strobe and the load strobe. In effect, the refresh counter 114,116,146 is cleared, the configuration 138, burst count 132 and the mask registers 134 are preloaded, the toggle and reset flip flops 144,142 are cleared and the *Bank Compare output is held inactive (high).

In the read/write mode ($MC_{1,0}$=1 0) the Clear/-Preload signal is held inactive (0) and the bank Compare Disable signal is also held inactive (0) and the low going edge of RASI in this mode generates the bank register strobe. In effect, the contents of the bank latch 126 are loaded into the bank register 128 and the *Bank Compare output is enabled.

In the refresh mode ($MC_{1,0}$)=0 X) the Clear/Preload signal is held inactive (0) and the Bank Compare Disable signal is activated (1) and the low going edge of RASI in this mode generates the refresh strobe. In effect, the refresh counter 114,116,146 is incremented and the *Bank Compare output is held inactive (high).

When auto timing mode is selected via the Timing Mode (TM) bit in the configuration register 138 (TM=0), circuit 110 is capable of generating internal timing delays between the RASI-MSEL and MSEL-CASI.

In the auto timing mode the CASI/CASIEN input acts as the CAS Input ENable (CASIEN). In this mode a Timing Generator CAS (TGCAS) signal is generated from the active (high) edge of the RASI input by the auto timing circuit 110 and is ANDed with the CASIEN input to generate the INTernal CAS (INTCAS) signal. This feature is used for burst mode operation. TGCAS is deactivated (low) when the RASI input is deactivated (low). In the external timing mode, INTCAS follows the CAS input.

In summary, in the read/write mode the controller latches the row, column and bank addresses and multiplexes them to the DRAM array under the control of a row address strobe input (RASI) signal. Either internally generated timing strobes in an auto timing mode or externally generated MSEL and CASI signals in the external timing mode also control such multiplexing operations. Auto and external timing circuitry is provided at reference numeral 110. The timing option Auto or External is selected via a Timing Mode (TM) bit in the configuration register 138.

The row address is latched in the DRAMs by the active (low going) edge of *$RAS_i$output, which follows the active (high going) edge of the RASI input. The address lines are then switched to column address by either an internally generated signal in the auto timing mode or by pulling MSEL active high in the external timing mode. The column address is latched in the DRAMs on the active (low going) edge of the *CAS$_i$ output, which follows either an internally generated signal in the auto timing mode or the active (high going) edge of CASI input in the external timing mode.

The read/write mode of the controller may be optimized for the shortest memory access time. This optimization is done in three different ways.

First, the controller is designed to support burst/block access when requested by the processor. In this mode, the initial row, column and bank addresses are latched and subsequent column addresses are generated internally by the controller. Hence, consecutive memory locations are accessed at high speed without the processor actually generating each memory location address. This type of transfer can be used by high performance processors to fill on-chip or external caches, when a caches miss occurs.

Second, in the "cache" access mode, the *RAS$_i$ output is held active (low) and any location in that row is accessed only by changing the column address. In this way, the entire row appears as if it were a cache, since any access within the row can be made at high speed. For the "cache" access mode, the Bank Interleave (BI) bit in the configuration register 138 is reset (0). The row and bank addresses of consecutive accesses are compared. If the row and bank addresses of consecutive accesses match, the *Cache Hit (*CH) signal goes active (low) and informs the timing generator 110 not to deactivate the RASI input but only to toggle the CASI/CASIEN input. If the row and bank addresses of consecutive accesses do not match, the *CH signal goes inactive (high) and informs the timing generator 110 to deactivate the RASI input and start a new RASI cycle after the current cycle has been precharged. When the RASI input is deactivated, its low going edge loads the row 107 and bank 128 registers with the contents of the row 106 and bank 126 latches respectively, saving the new values for the next comparison.

Third, the controller can be configured to support bank interleaving by connecting the two lowest significant bits of the processor address to the bank select lines and by setting (1) the Bank Interleave (BI) bit in the configuration register 138. Accesses made to consecutive locations will be in adjacent banks. Hence, the entire memory array can be refreshed by stepping through the row address counter once. A row refresh counter 114 is updated to the next refresh address by the inactive (high-to-low) edge of the RASI input. When memory "scrubbing" is performed, both the row and column address counters are used. In this case, all four corresponding rows are refreshed and one location of one row is "scrubbed" (i.e., a read/modify/write cycled is performed). An entire memory array can be "scrubbed" by stepping through the row, column and bank address counters once.

The input signals are shown on the left side of the Figure and are described hereinbelow. All inputs and outputs are TTL compatible. All signals and strobes are standard TTL unless otherwise stated.

A$_{21}$-A$_0$ (Address Inputs$_{21-0}$), shown at reference numerals 100 and 102, drive the DRAM address lines Q$_{10-0}$ 122 when the controller is in read/write mode. A$_{10-0}$ 100 are latched as the column address, and will drive Q$_{10-0}$ 122 when the MSEL (Multiplexer SELect) signal is high and the controller is in the read/write mode. A$_{21-11}$ 102 are latched as the row address and will drive Q$_{10-0}$ 122 when MSEL is low and the controller is in the read/write mode. The addresses are latched by the low going edge of the Address Latch Enable (ALE) signal.

Sel$_{1,0}$ (Bank SELect$_{1,0}$) are the two highest order address bits when in normal access or burst/block access mode, but the two lowest order in the bank interleave mode. In either case, SEL$_{1,0}$ are used in the read/write mode to select which bank of memory will receive the *RAS$_i$ and *CAS$_i$ signals when RASI and CASI go active high. The *CAS$_i$ signals will not be decoded from SEL$_{1,0}$ if the byte decode scheme is selected.

ALE (Address Latch Enable) signal 104 causes the row latch, the column latch and counter 108 and the bank latch 126 to become transparent allowing the latches to accept new input data. A low input on ALE 104 latches he input data, assuming it meets setup and hold requirements.

MSEL/MSELEN (Multiplexer SELect/Multiplexer SELect ENable) is a dual function input. In the external timing mode (TM=1 in the configuration register 138) this input acts as MSEL and in the auto timing mode (TM=0) it acts as MSELEN. In the external timing mode INTernal Multiplexer SELect (INTMSEL) signal follows the MSEL input. In the auto timing mode the Timing Generator Multiplexer SELect (TGMSEL) signal is generated from the RASI input and is gated with the MSELEN input to generated the INTMSEL signal.

In both cases, when INTMSEL is high the column address is selected, while the row address is selected when INTMSEL is low. The address may come from either the address latches and counter 106, 108, 126 or the refresh address counter 114,116,146 depending on MC$_{1,0}$, as hereinbelow described.

*CS (Chip Select) input is used to enable the controller. When *CS is active, the controller operates normally in all four modes. When *CS goes inactive, the device will not enter the read/write mode.

*OE (Output Enable) input enables/disables the output signals. When *OE is inactive the outputs of the controller enter the high-impedance state. The *OE signal allows more than one controller to control the same memory, thus providing a method for multiple access to the same memory array.

MC$_{1,0}$ (Mode Control$_{1,0}$) inputs are used to specify which of the four operating modes the controller should be using. The four functions of mode control are shown hereinbelow in Table 1, Mode Control Function Table.

TABLE 1

MODE CONTROL FUNCTION TABLE

| Mode Control Setting | | |
|---|---|---|
| MC$_1$ | MC$_0$ | Operating Mode |
| 0 | 0 | Refresh Without Scrubbing |
| | | (a) RAS Only Refresh: Refresh cycles are performed with only the row counter generating addresses. In this mode, all four *RAS$_i$ outputs are active while the four *CAS$_i$ signals are held inactive. |
| | | (b) CAS Before RAS Refresh: Refresh address is generated internally by the DRAMs. In this mode, all four *CAS$_i$ outputs are active followed by all four *RAS$_i$ outputs going active. |
| 0 | 1 | Refresh with Scrubbing/Initialize |
| | | This mode may be used only in systems |

TABLE 1-continued
MODE CONTROL FUNCTION TABLE

| Mode Control Setting | | |
|---|---|---|
| MC$_1$ | MC$_0$ | Operating Mode |
| | | with EDC capability. In this mode, refresh cycles are performed with both the row and column counters generating the addresses. MSEL is used to select between the row and column addresses. All four *RAS$_i$ signals go active in response to RASI, while only one *CAS$_i$ output goes active in response to CASI. *CAS$_i$ output is decoded from the bank counter. This mode is also used to initialize the memory by writing a known data pattern and corresponding check bits. |
| 1 | 0 | Read/Write |
| | | This mode is used to perform read/write operations. The row address is taken from the row latch and the column address is taken from the column latch counter. Sel$_{1,0}$ are decoded to determine which *RAS$_i$ and *Case$_i$ will be active. |
| 1 | 1 | Reset |
| | | This mode is used to clear the refresh counter, the reset and toggle flip flops, and preload the burst count register, the mask register and the configuration register. The above operations are performed on the high-to-low transition of RASI. In this mode, all four *RAS$_i$ outputs are driven active (low) in response to a RASI going active (high) so that DRAM wake-up cycles may be performed. |

$Q_{10,0}$ (Address Outputs$_{10-0}$) 122 drive the DRAM address inputs. The drivers on these lines are specified at 500 pF capacitive load.

RASI (Row Address Strobe Input) signal is used as follows. During normal memory cycles, one of the decoded *RAS$_i$ output signals (*RAS$_3$, *RAS$_2$, *RAS$_1$ or *RAS$_0$) is forced low after RASI goes active high. In either refresh mode, all four *RAS$_i$ outputs go low after RASI goes active high. If auto timing is enabled by circuit 110, the high going edge of RASI also initiates the internal timing cycle and its low going edge terminates the internal timing cycle.

*RAS$_{3-0}$ (Row Address Strobe$_{3-0}$) provide a *RAS$_i$ signal to one of the four banks of the dynamic memory. Each will go low when selected by SEL$_{1,0}$ and only when RASI goes high. All four go low in response to RASI in the refresh modes. All the outputs are specified at 350 pF capacitive load and have weak pull-up resistors on them to avoid accidental starting of a cycle.

CASI/CASIEN (Column Address Strobe Input/Column Address Strobe Input Enable) is a dual function input. In the external timing mode (TM=1 in the configuration register 138), this input acts as CASI. In the auto timing mode (TM=0) it acts as CASIEN.

In the external timing mode the INTernal Column Address Strobe signal (INTCAS) follows the CASI input. In the auto timing mode the Timing Generator Column Address Strobe (TGCAS) is generated from the RASI input and is gated with the CASIEN input to generate the INTCAS signal.

When used as CASI with the bank scheme as the CAS decode scheme, the internally decoded *CAS$_i$ output (*CAS$_3$, *CAS$_2$, *CAS$_1$ or *CAS$_0$) is forced low after CASI goes active. When used as CASI with the byte scheme as the CAS decode scheme, the selected *CAS$_i$ output is forced low depending on the externally decoded *CASEN$_i$ byte inputs after CASI goes active.

When used as CASIEN with the bank scheme as the CAS decode scheme, the decoded *CAS$_i$ output is forced low, if both the internally generated TGCAS and the CASIEN signals are active.

*CAS$_{3-0}$ (Column Address Strobe$_{3-0}$) outputs each provide a *CAS$_i$ signal to one of the four banks of the dynamic memory. Each will go active when selected by SEL$_{1-0}$ in the bank scheme or when selected by *CASEN$_3$, *CASEN$_2$, *CASEN$_1$, *CASEN$_0$ in the byte scheme and only when CASI goes active in the external timing mode and when CASIEN and TGCAS go active in the auto timing mode. All the outputs are specified at 350 pF capacitive load and have weak pull-up resistors on them to avoid accidental starting of a cycle.

*CASEN$_{3-0}$ (Column Address Strobe Enable$_{3-0}$) are decoded externally to handle byte operations when the byte scheme is used as the CAS decode scheme. The timing generation may be Auto or External. Only those *CAS$_i$ outputs will be activated whose corresponding *CASEN$_i$ inputs are activated by the external byte decode circuit.

RL/CC (Register Load/Column Clock) is a dual function input applied to an RL/CC decoder 168. The function depends on the Mode Control inputs (MC$_{1,0}$) If MC$_{1,0}$=1 1, the controller is in the reset mode. This input acts as the register load signal. If MC$_{1,0}$=1 0, the controller is in the read/write mode and this input acts as the column clock signal. When used as register load, the low-to-high edge of this signal loads either the burst count register 132, or the mask register 134 or the configuration register 138 via the A$_{10-0}$ address inputs 100. The burst count register 132 indicates the number of memory accesses permitted in the burst or block mode of transfer and the mask register 134 indicates which bits of the burst count register 132 participate in the column address compare in the burst or block mode of data transfer. The configuration register 138 indicates the different configuration selected. When used as column clock, the high-to-low edge of this signal increments the column counter, the output of which goes to Q$_{10-0}$ 122 via the address multiplexer 118 and also to the DRAM page boundary logic and the column compare logic.

*BC/*CH/TC (*Bank Compare/*Cache Hit/Terminal Count) is a triple function output. The function depends on the mode control inputs and the Bank Interleave (BI) bit in the configuration register 138. If the MC$_{1,0}$ inputs are [0 1], the controller is in the refresh with scrubbing or initialize mode and this output acts as the terminal count. In all other modes with MC$_{1,0}$ [0 0], [1 0] and [1 1] this output acts as either the *Bank Compare signal if BI=1 or as *Cache Hit signal if BI=0. As *Bank Compare this output goes active (low) when the current memory access is to the same bank as the previous memory access and remains active until a memory access to a different bank is requested. This signal is used by the external timing generator 110 during bank interleaving to either activate the RASI input immediately if two consecutive accesses are to two different banks or delay the RASI input if two consecutive accesses are to the same bank. As *Cache Hit this output goes active (low) when the current memory access is to the same row and the same bank as the previous access. This signal is used by the external timing generator 110 during the cache mode to allow the RASI signal to remain active. As terminal count this output goes active (high) when the refresh counter has gone through an entire count. The refresh counter is automatically adjusted for DRAM size (64K, 256K, 1M or 4M) and number of DRAM banks (2 banks or 4 banks). DRAM configuration is programmable via the RAS/CAS configuration bit of the configuration register 138. This signal is used to indicate the end of initialization in an error detection and correction (EDC) system. Initialization is writing a known data pattern with a corresponding check bit pattern into the entire memory array before the memory is used.

EBM (End Burst/Clock Mode) is used only in the burst or block mode of data transfer. It indicates to the processor that the controller cannot perform any more data transfers in the burst or block mode because of one of two reasons: the DRAM page boundary is reached, in which case a new row address is required from the processor; or the allowable number of transfers as indicated by the burst count register 138 have been performed.

The burst/block access mode is used by processors or other electronic devices known as masters using a cache memory. In this access mode the processor provides the initial memory address and then requests a burst access. If the controller or slave acknowledges the burst request, the processor expects the controller to access consecutive memory locations without the processor providing any further memory address. The access may be terminated by either the processor or by the controller.

This type of operation frees the address bus and allows faster memory accesses. Since consecutive memory locations are accessed, most of them fall on the same row on the DRAM and hence the row address need not be changed. Only the column address need be incremented for consecutive memory address generation. Since the row address need not be changed, the row address strobe need not be deactivated and then again reactivated, which saves on the RAS precharge time, which is on the order of the DRAM access time. This in turn, allows faster access times.

An alternate embodiment of burst access mode consists of ending the burst access mode differently. The controller keeps track of the number of accesses being made and allows only a fixed number of accesses which the processor can handle. The burst count register and the mask register are used on the controller to handle these types of burst accesses and to signal the processor when the programmable number of transfers are executed.

Another embodiment of the burst access mode consists of the processor making a normal access request and the controller always making four accesses to the memory. The four accesses are consecutive but in wrap around order. In this type of access if nibble mode DRAMs are used, the initial access is made in a normal way and the next three accesses are made by simply toggling the *$CAS_i$ stroke. If however, normal DRAMs are used, the initial access is made in the normal way and the *$RAS_i$ strobe is held active for the next access. The column counter is clocked by the Column Clock (CC) signal and the *$CAS_i$ strobe is toggled. This procedure is repeated for two more accesses.

The controller also supports "cache" access mode. In this mode of access the *$RAS_i$ output is held active (low) and any location in that row is accessed only by changing the column address, thereby making the entire row appear as a cache, since any access within the row can be made at high speed. For the "cache" access mode, the Bank Interleave (BI) bit in the configuration register is reset (0). The row and bank addresses of consecutive accesses are compared. If the row and bank addresses of consecutive accesses match, the *Cache Hit (*CH) signal goes active (low) and informs the timing generator not to deactivate the RASI input but only to toggle the CASI/CASIEN input. If the row and bank addresses of consecutive accesses do not match, the *CH signal goes inactive (high) and informs the timing generator to deactivate the RASI input and start a ne RASI cycle after the current cycle has gone through a precharge. When the RASI input is deactivated, its low going edge loads the row and bank registers with the contents of the row and bank latches respectively, saving the new values for the next comparison.

Referring now also to FIG. 12 there is shown a timing diagram of signals ALE, RASI, *$RAS_{3-0}$ and *CH (row compare signal). At point A, marking the beginning of the cycle, the first row address is latched and the RASI signal goes high. At point B, the next row address is latched in and, if a comparison with the previous row address is unsuccessful, the RASI signal goes low for the precharge time and then goes high for accessing the row address. At point C, another row address is latched in and, in this case, if the comparison between the present row address and the previous row address is successful (i.e., both row addresses are on the same row), then the RASI line is maintained in a high state, avoiding the precharge time required when the comparison is unsuccessful. Therefore, what is shown in this FIG. is a new row address at point A, a new row address at point B, the same row address at point C as appeared at point B and the same row address in point D as appeared at points B and C.

A precharge time is required for the $RAS_{3-0}$ line every time the line goes high. The RAS line must be low as a requirement of the DRAM that it accesses.

Referring now also to FIG. 13 there is shown a block diagram of the circuitry in FIG. 11 that is used for testing the counter. The circuitry is normally implemented only during testing but before shipment to a customer. The configuration register 138 generates a TST signal to a multiplexer 200 (shown as reference numeral 10 in FIG. 2). Operation of the multiplexer 200 is described in connection with the description of FIG. 2 hereinabove. A 6-bit and 5-bit counter are attached to the multiplexer 200 and in combination form the row refresh counter 114 and column refresh counter 116, as shown in FIG. 11.

The counters 114, 116 are shown in this FIG. 13 for use as a carry between the 5-bit and the 6-bit portion of an 11-bit tester. The output of the counter 114, 116 is applied to the address multiplexer 118 and, by means of the buffer 120, to the address line 122 which is applied to the DRAM, as described in greater detail hereinabove. It should be noted that address line 122 is not applied to the DRAMs during testing. FIG. 13 is shown for simplicity. It should be understood, however, that another block 114, 116, which includes a multiplexer 200 and a 6-bit and a 5-bit counter, is actually applied to another of the input lines to the address multiplexer 118. Thus, as can be seen in FIG. 11, two 11-bit buses are applied to the address multiplexer, one from the row refresh counter 114 and the other from the column refresh counter 116.

Figure 14:
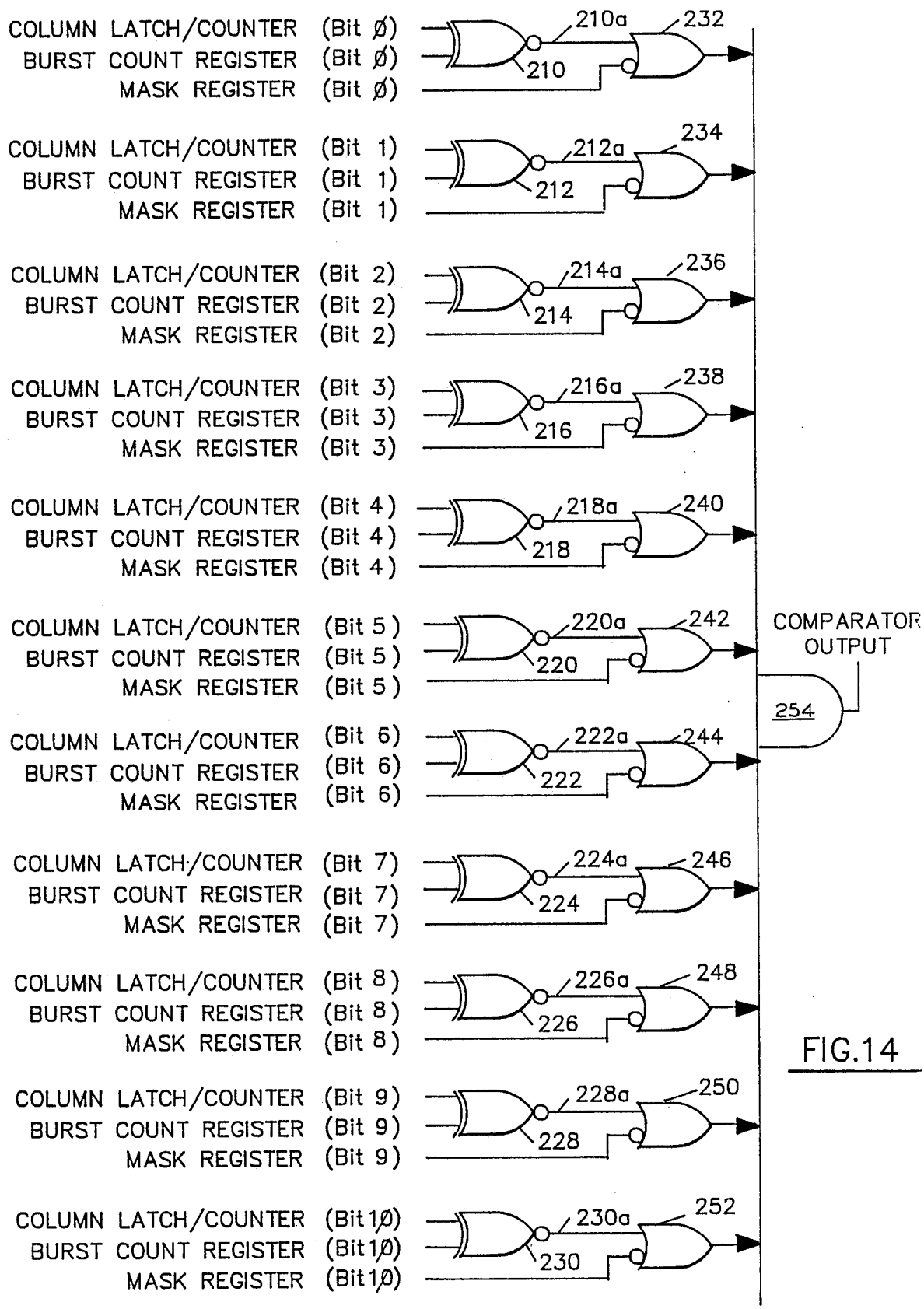
FIG. 14 is a schematic logic diagram of the comparator logic used for burst mode operation.

Referring now also to FIG. 14, there is shown a logic diagram of the internal workings of comparator logic 136, as first shown in FIG. 11. A plurality of EX-NOR gates 210-230 have applied to them on a single bit basis a column latch/counter signal and a burst count register signal. That is, each signal is applied to each logic device 210-230 for each of the bits to be processed. Two bits are compared at a time. In this example, eleven sets of bits are processed. The column latch/counter register is shown at reference numeral 108 (FIG. 11) and the burst count register is shown at reference numeral 132. The output of the EX-NOR gates 210-230 is an intermediate comparison signal 210a-230a.

The mask register 134 has values loaded for each bit by the processor. The mask register bits are ORed on a bit by bit basis with the intermediate comparison signals 210a-230a by means of OR gates 232-252. The resulting bit signals are applied to an 11-input AND gate 254, resulting in a Comparator Output signal. If the Comparator Output signal is high, it indicates that the unmasked portion of the column latch/counter 108 compares favorably with the unmasked portion of the burst count register 132, resulting in a end of burst condition.

An End of Burst Mode (EDM) signal is generated when either the Comparator Output signal is high from the 11-input AND gate 254 or the DRAM page boundary logic 158 indicates that the end of a page has been reached in the DRAM. In either case, the processor, not shown, will be informed that no more data can be transferred within that processed burst. Alignment of the next burst is automatic at this point, due to the fact that the previous data which formed a complete or a partial burst has been terminated. From this point on, all bursts are aligned. The number of accesses in the next burst will be the total maximum number of transfers per burst.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed is:

1. A method of minimizing memory access time on a memory with multiplexed address inputs between data stored in locations in memory in the same row but in different columns, the steps comprising:
    (a) accessing first data at a predetermined column and row location;
    (b) recording said predetermined row location of said first data;
    (c) recording the row location of second data;
    (d) comparing row locations of said first and said second data;
    (e) generating a row compare signal and maintaining a row address strobe in a charged state to eliminate the necessity for strobe precharging when accessing said second data if said row locations of both first and second data are identical; and
    (f) varying only said column address to said memory in response to said row compare signal, said varying step initiating access of said second data.

2. The method in accordance with claim 1, further comprising the steps of:
    (g) updating a storage register with the address of said second data when said comparison of locations of said first and second data is not identical.

3. The method in accordance with claim 1, wherein during said step of accessing first data, a row address strobe signal is enabled.

4. The method in accordance with claim 3, wherein during said step of varying only said column address, said row address strobe signal is maintained.

5. The method in accordance with claim 4, wherein said row address strobe signal is maintained by a timing generator.

6. The method in accordance with claim 4, wherein said row address strobe signal is disabled when said comparison of row locations of said first and second data is not identical.

7. A method of minimizing memory access time on a memory with multiplexed address inputs between data stored in locations in memory in the same bank and row but in different columns, the steps comprising:
    (a) accessing first data at a predetermined bank, column and row location;
    (b) recording said predetermined bank and row locations of said first data;
    (c) recording the bank and row locations of second data;
    (d) comparing bank and row locations of said first and said second data;
    (e) generating a compare signal and maintaining a row address strobe in a charged state to eliminate the necessity for strobe precharging when addressing said second data if said bank and said row values of both said first and second data are identical; and
    (f) varying only said column address to said memory in response to said compare signal, said varying step initiating access of said second data.

8. The method in accordance with claim 7, further comprising the step of:
    (g) updating a storage register with the address of said second data when said comparison of location of said first and second data is not identical.

9. The method in accordance with claim 7, wherein during said step of accessing first data, a row address strobe signal is enabled.

10. The method in accordance with claim 9, wherein during said step of varying only said column address, said row address strobe signal is maintained.

11. The method in accordance with claim 10, wherein said row address strobe signal is maintained by a timing generator.

12. The method in accordance with claim 10, wherein said row address strobe signal is disabled when said comparison of locations of said first and second data is not identical.

13. The method in accordance with claim 1 wherein said memory is a DRAM.

14. The method in accordance with claim 13 wherein said DRAM is a page mode DRAM.

15. The method in accordance with claim 13 wherein said DRAM is a fast page mode DRAM.

16. The method in accordance with claim 13 wherein said DRAM is a nibble mode DRAM.

17. The method in accordance with claim 7 wherein said memory is a DRAM.

18. The method in accordance with claim 17 wherein said DRAM is a page mode DRAM.

19. The method in accordance with claim 17 wherein said DRAM is a fast page mode DRAM.

20. The method in accordance with claim 17 wherein said DRAM is a nibble mode DRAM.

* * * * *